United States Patent
How et al.

(10) Patent No.: US 9,202,778 B2
(45) Date of Patent: Dec. 1, 2015

(54) INTEGRATED CIRCUIT PACKAGE WITH DIE ATTACH PADDLE HAVING AT LEAST ONE RECESSED PORTION

(71) Applicant: Texas Instruments Incorporated, Dallas, TX (US)

(72) Inventors: You Chye How, Melaka (MY); Maria Christina Bernando Violante, Pasig (PH)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 13/974,323

(22) Filed: Aug. 23, 2013

(65) Prior Publication Data

US 2015/0054145 A1 Feb. 26, 2015

(51) Int. Cl.
*H01L 23/52* (2006.01)
*H01L 23/495* (2006.01)
*H01L 23/00* (2006.01)

(52) U.S. Cl.
CPC .......... *H01L 23/49575* (2013.01); *H01L 23/00* (2013.01); *H01L 23/49503* (2013.01); *H01L 23/49513* (2013.01); *H01L 23/49548* (2013.01); *H01L 24/85* (2013.01)

(58) Field of Classification Search
USPC .......... 257/666, 676, 691, 723, 724, 686, 777
See application file for complete search history.

(56) References Cited

U.S. PATENT DOCUMENTS

| | | | |
|---|---|---|---|
| 2006/0170081 A1* | 8/2006 | Gerber et al. | 257/666 |
| 2011/0001224 A1* | 1/2011 | San Antonio et al. | 257/666 |
| 2011/0193208 A1* | 8/2011 | Xue et al. | 257/676 |
| 2013/0105955 A1* | 5/2013 | Kim et al. | 257/676 |
| 2014/0001621 A1* | 1/2014 | Liao | 257/676 |
| 2014/0048919 A1* | 2/2014 | Bathan et al. | 257/676 |

* cited by examiner

*Primary Examiner* — S. V. Clark
(74) *Attorney, Agent, or Firm* — Steven A. Shaw; Charles A. Brill; Frank D. Cimino

(57) ABSTRACT

An integrated circuit package having a die attach paddle, a power die mounted on the die attach paddle and a controller die mounted on the die attach paddle. The die attach paddle has at least one recessed portion at least partially underlying the controller die.

6 Claims, 3 Drawing Sheets

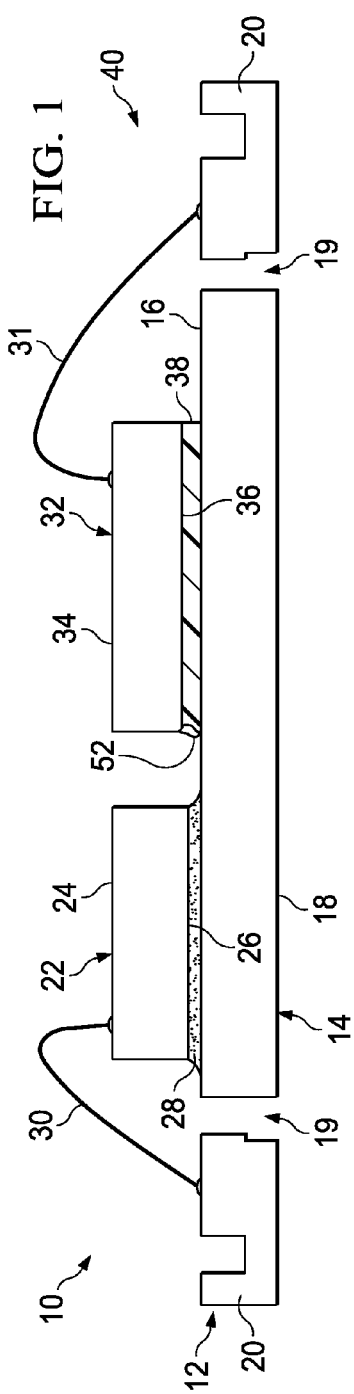
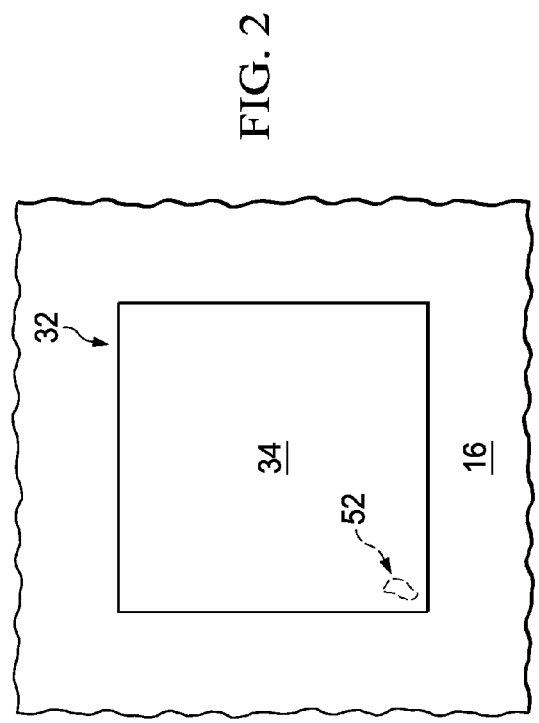

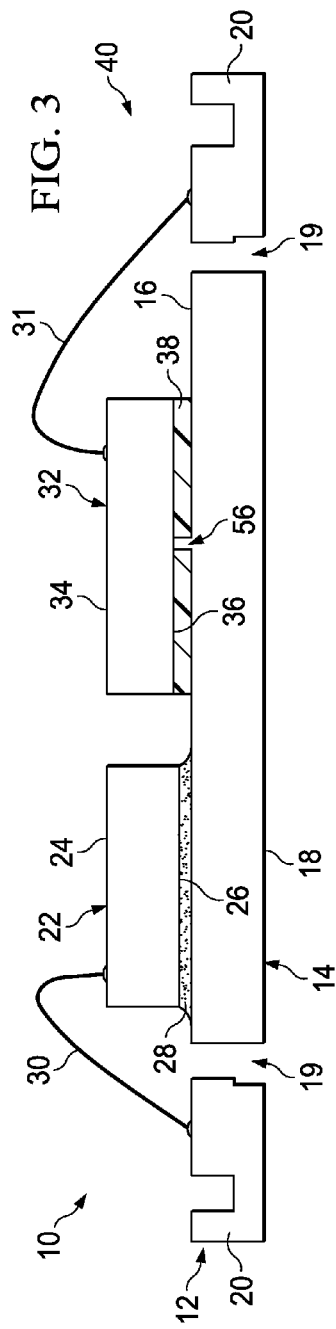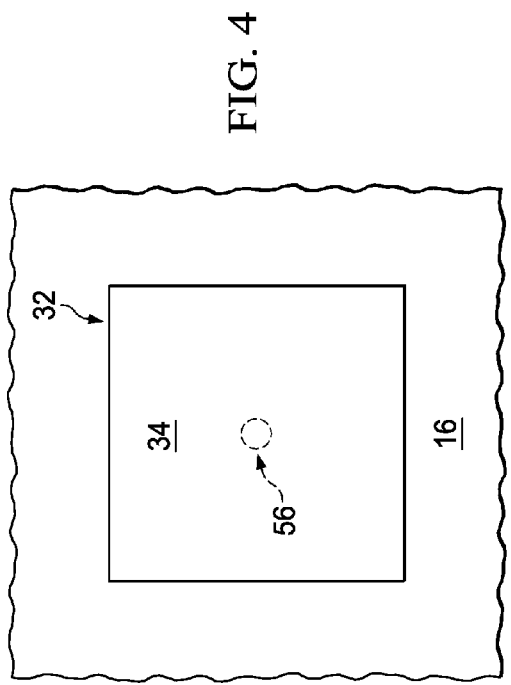

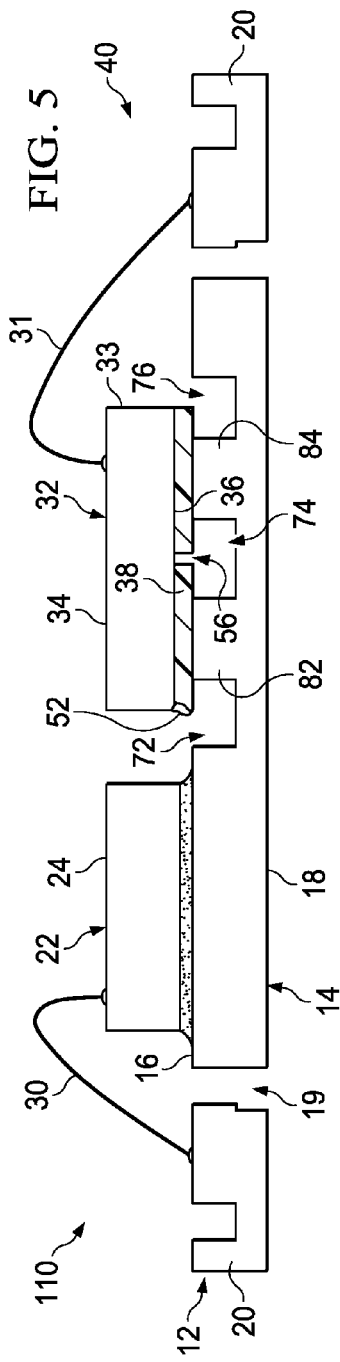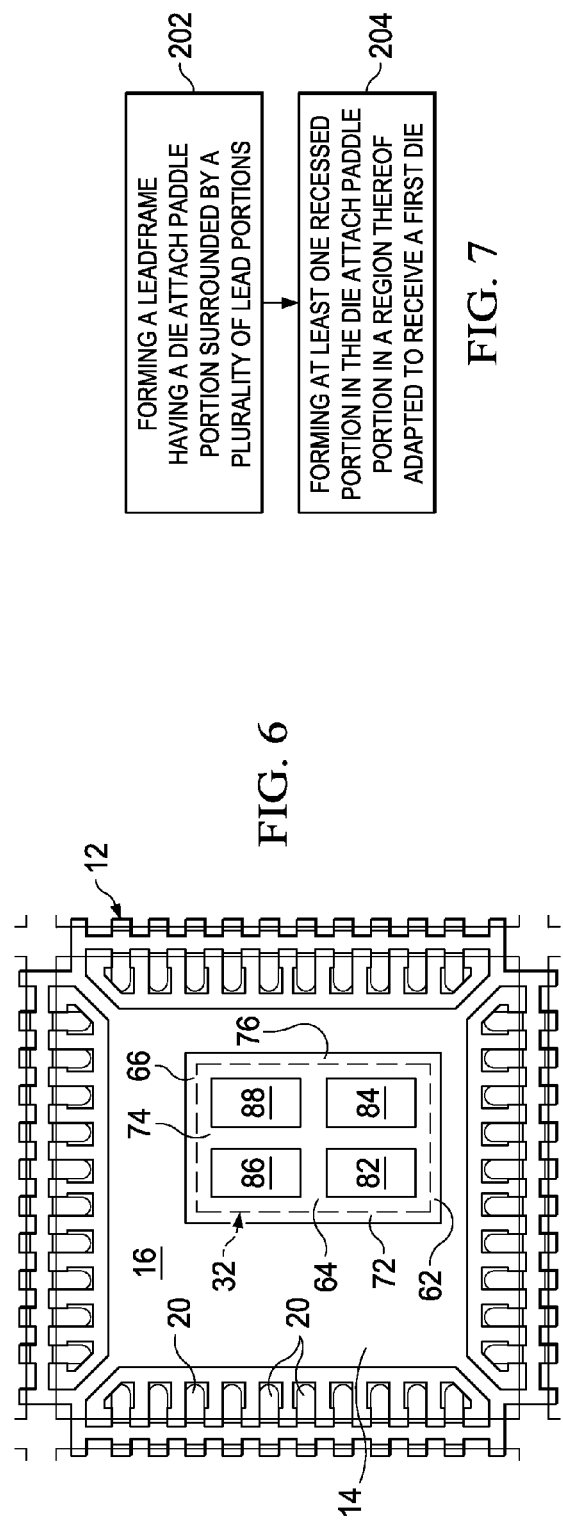

INTEGRATED CIRCUIT PACKAGE WITH DIE ATTACH PADDLE HAVING AT LEAST ONE RECESSED PORTION

BACKGROUND

Integrated circuit packages are produced in a variety of different configurations for different purposes. A typical integrated circuit package includes a leadframe having a die attach paddle (pad) and a plurality of surrounding leads. A die is typically mounted on the die attach paddle either by a conductive or nonconductive adhesive layer. One or more contacts on a top surface of the die are typically attached to one or more of the leadframe leads by bondwires.

The leadframe, die and bondwires are generally encapsulated in mold compound which protects the various components of the die package from moisture, etc. Portions of the die attach paddle may be exposed to enable heat dissipation from the package. Portions of the leads are also exposed to enable electrical connection of the package to other electronic components.

In some integrated circuit packages multiple dies are attached to the die attach paddle. In one known package configuration a power die is mounted on the die attach paddle with conductive epoxy and a controller die is mounted on the die attach paddle with nonconductive epoxy. Each die is connected by bondwires to one or more leads. Such a configuration is sometimes provided in a quad-flat no-leads package ("QFN") in which the bottom of the die attach paddle is exposed and surface portions of the leads are exposed at the bottom and side walls of the package.

BRIEF DESCRIPTION OF THE DRAWINGS

FIG. 1 is a schematic cross sectional elevation view of an integrated circuit package illustrating a defect discovered by applicants.

FIG. 2 is a schematic top plan view of a portion of the integrated circuit package of FIG. 1.

FIG. 3 is a schematic cross sectional elevation view of an integrated circuit package illustrating another defect discovered by applicants.

FIG. 4 is a top plan view of a portion of the integrated circuit package of FIG. 3.

FIG. 5 is a schematic cross sectional elevation view of an integrated circuit package having a plurality of half etched channels positioned below a controller die.

FIG. 6 is a top plan view of a lead frame which is half etched as illustrated in FIG. 5, prior to mounting of dies thereon.

FIG. 7 is a flow chart illustrating a method of making an integrated circuit package.

DETAILED DESCRIPTION

This specification, in general, discloses an integrated circuit package 10 having a die attach paddle 14 as illustrated in FIGS. 5 and 6. A power die 22 and a controller die 32 are mounted on the die attach paddle 14. The die attach paddle 14 has at least one recessed portion, e.g., 72, which is at least partially underlays the controller die 32.

FIG. 1 illustrates a problem in an integrated circuit package 10 such as a quad flat no leads integrated circuit package (QFN). The IC package 10 includes a lead frame 12 having a die attach paddle 14 with a top surface 16, a bottom surface 18 and a plurality of leads 20. The leads 20 are separated from the die attach paddle 14 by voids 19.

A power die 22 having a top surface 24 and a bottom surface 26 is mounted on the top surface 16 of the die attach paddle by a layer of conductive adhesive 28 such as conductive die attach film or conductive epoxy. A bond wire 30 connects a contact surface on the power die to one of the leads 20.

A controller die 32 having a top surface 34 and a bottom surface 36 is attached to the top surface 16 of the die attach paddle 14 by a nonconductive die attach film 38. As is known in the art controller dies, such as die 32, are singulated from a controller die wafer. Prior to singulation of the controller die wafer, the wafer is attached at its lower surface to a sheet of nonconductive die attach film (not shown). The sheet of die attach film is attached to the top surface of a sheet of dicing tape (not shown), which is, in turn, attached at its periphery to a wafer frame. During singulation of the wafer, a singulating saw cuts entirely through the wafer and entirely through the die attach film sheet and half way through the sheet of dicing tape. A pick-and-place head engages a top surface of each die, one at a time, and places each die on an associated die attach paddle. A singulated portion of die attach film sheet is retained on the bottom surface of each die as it is lifted from the dicing tape sheet. The singulated portion of the nonconductive die attach film sheet, referred to herein as the nonconductive die attach film layer 38, is thus positioned between the controller die 34 and the top surface 16 of the die attach paddle 14 to which the die 34 is transferred. The nonconductive die attach film layer 38 thus holds the associated die 34 on the die attach paddle 14 in electrical isolation from the die attach paddle 14.

A bond wire 31 may connect a contact on the controller die 32 to a leadframe lead 20. The leadframe 12, power die 22, controller die 32 and bondwires 30, 31 may all be encapsulated in mold compound 40. In a typical QFN package, the die attach paddle bottom surface 18 is exposed through the mold compound 40. Bottom and end surfaces of the leads 20 are also exposed through the mold compound 40.

Applicant has discovered that during the controller die singulation process, silicon splinters, such as splinter 52, may become embedded in the die attach film layer 38 near the periphery of the controller die 32. Such splinters 52 may create an electrical path between the controller die and the die attach paddle 14. Because the die attach paddle 14 is electrically connected to the power die 22, this leakage path provided by the silicon splinter 52 may cause a short circuit to the power die 22, resulting in failure of the integrated circuit package 10. FIG. 2 is a top plan view of the controller die 32 illustrating a typical position of a silicon splinter 52 about the periphery of the controller die 32.

FIG. 3 illustrates another source of defects in integrated circuit packages that has been discovered by applicant. The structure of the illustrated integrated circuit package is the same as that illustrated in FIG. 1. However, in the integrated circuit package of FIG. 3, a defect is caused by a hole 56 produced in the center of the die attach film layer 38 by an ejector needle (not shown) that pushed through the layer 38 during die ejection from a die bonding machine (not shown). This hole 56 which is typically on the order of 0.05 mm to 0.2 mm in diameter places the bottom surface 36 of the controller die sufficiently close to the top surface 16 of the die attach paddle 14 to create an electrical path to the die attach paddle 14 and thence to the power die 22. FIG. 4 is a top plan view of the power die 22 mounted on the die paddle 14 showing the hole 56 in hidden lines. Thus, the result of such a hole in the film layer 38 is often a short circuit and resulting failure of the integrated circuit package 10.

An integrated circuit package 110, which obviates package failures caused by silicon splinters 52 or ejector pin holes 56, is illustrated in FIG. 5. The structure of this IC package 10 may be substantially the same as that described above with respect to FIGS. 1-4. A difference is that at least one recessed portion, e.g., 72 or 74 is provided beneath the controller die 34 and die attach film 38. In the embodiment illustrated in FIGS. 5 and 6, three parallel channels 62, 64 and 66 intersect at right angles with three other parallel channels 72, 74 and 76. (The position of the periphery of a controller die 34 when it is mounted on the die attach paddle 14 is indicated in dashed lines in FIG. 6.) The channels 62, etc., may be formed by half etching the die attach paddle 14. The half etching process is known in the art and will thus not be further described herein. The channels 62, etc., are provided in an arrangement such that the peripheral portion 33 of the controller die 32 is suspended within the half etch channels, specifically channels 62, 66, 72 and 76. Since any silicon splinters 52 are located in the die attach film 38 at the periphery 33 of the controller die, any such splinter 52 is suspended well above the closest electrical contact surface of the die attach paddle 14, and thus it is incapable of producing a current path to the die attach paddle 14. Accordingly, this potential cause of IC package failure is eliminated.

As further shown by FIG. 5, the intersecting channels 74, 64 create an open space between the center of the controller die 34 where any die attach film void 56 produced by an ejector pin would be located. Thus, there is no electrical path provided between the bottom surface 36 of the controller die 34 and the die attach paddle 14. Thus, this potential failure causing defect is also obviated by the die paddle half etching configuration shown in FIG. 6.

Various alternative channel configurations could be provided. For example, one of the two channels 64, 74 could be eliminated if the other channel were made sufficiently large. In situations where an ejector pin void 56 is rarely encountered, the etching of channels 64 and 74 could be eliminated. Similarly, in situations where silicon splinters 52 are rarely encountered, the peripheral recesses 66, 62, 72, 76 could be eliminated. However, since the etching process is a relatively simple and inexpensive process, it may in most cases make sense to simply provide the etched channels indicated in FIGS. 5 and 6 in any situation where either of the above discussed defects is a possibility.

It will be understood by those skilled in the art that the above-described die attach paddle construction has a number of advantages. No change in package form, fit and function occurs as a result of the half etched channels. The silicon thickness of the controller die 34 and power die 22 and the mold compound thickness are unchanged. All the materials used to make the package remain unchanged. Also, there is no change of in the process flow that is used to make this package 110 as compared to the process flow for making the package 10.

There is no additional cost associated with making the package 110 illustrated in FIG. 5 as compared to the cost of package 10 illustrated in FIGS. 1 and 3. The only additional features of the package 110 are the half etch channels on the die attach paddle 14. These channels 62, etc., are typically etched by a lead frame supplier at the same cost as that for forming the lead frame shown in FIG. 1, since the leadframe etching processes for the package 10 of FIG. 1 and the package 110 are both a one mask process. Again, this configuration solves the problems of electrical leakage failure between the controller die and the die attach paddle due to silicon splinters in the die attach film and/or due to a central hole in the die attach film produced by a die ejector pin.

FIG. 7 is a flow chart illustrating a method of making an integrated circuit die package. The method includes forming a lead frame having a die attach paddle portion surrounded by a plurality of lead portions as shown at 202. The method also includes forming at least one recessed portion in the die paddle portion in a region thereof adapted to receive a first die, as shown at block 204.

Certain methods and structures for eliminating short circuits in an integrated circuit die package have been expressly disclosed in detail herein. Alternative embodiments of such expressly described structures and methods will become obvious to those skilled in the art after reading this disclosure. It is intended that the appended claims be construed broadly so as to cover such alternative embodiments, except as limited by the prior art.

What is claimed is:

1. An integrated circuit package comprising:
   a die attach paddle;
   a power die mounted on said die attach paddle; and
   a controller die mounted on said die attach paddle;
   wherein said die attach paddle comprises at least two middle channels underlying middle portions of said controller die and a plurality of peripheral channels at least partially underlying peripheral portions of said controller die.

2. The integrated circuit package of claim 1 further comprising a layer of nonconductive die attach film connecting said controller die to underlying surface portions of said die attach paddle.

3. The integrated circuit package of claim 2 further comprising a layer conductive adhesive connecting said power die to said die attach paddle.

4. An integrated circuit package comprising:
   a die attach paddle comprising a plurality of half etched channels in said die attach paddle underlying said controller die and defining a plurality of paddle islands;
   a power die mounted on said die attach paddle; and
   a controller die mounted on said die attach paddle, said controller die being attached to said paddle islands by a layer of nonconductive die attach material, and
   wherein said power die is attached to said die attach paddle by a layer of conductive die attach material.

5. The integrated circuit package of claim 4, said plurality of half etched channels in said die attach paddle below said controller die being filled with mold compound.

6. The integrated circuit package of claim 5 further comprising a plurality of leadframe lead portions positioned around said die attach paddle, at least one of said plurality of lead portions being electrically connected to said power die and at least one of said plurality of lead portions being electrically connected to said controller die, and wherein said die attach paddle and said lead portions and said power die and said controller die are encased in mold compound.

* * * * *